(12) United States Patent
Su

(10) Patent No.: US 12,009,212 B2
(45) Date of Patent: Jun. 11, 2024

(54) SEMICONDUCTOR DEVICE WITH REDUCED CRITICAL DIMENSIONS

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 407 days.

(21) Appl. No.: 17/510,918

(22) Filed: Oct. 26, 2021

(65) Prior Publication Data

US 2022/0044933 A1  Feb. 10, 2022

Related U.S. Application Data

(62) Division of application No. 16/440,354, filed on Jun. 13, 2019, now Pat. No. 11,355,342.

(51) Int. Cl.
*H01L 21/033* (2006.01)
*H01L 21/02* (2006.01)
*H01L 21/3115* (2006.01)

(52) U.S. Cl.
CPC .... *H01L 21/0338* (2013.01); *H01L 21/02255* (2013.01); *H01L 21/02271* (2013.01);
(Continued)

(58) Field of Classification Search
CPC .......... H01L 21/0338; H01L 21/02255; H01L 21/02271; H01L 21/0332; H01L 21/0335; H01L 21/0337; H01L 21/31155; H01L 21/3086; H01L 21/32139; H01L 29/42364; H01L 21/76897; H01L 23/5386; H01L 29/401; H01L 29/42356
See application file for complete search history.

(56) References Cited

U.S. PATENT DOCUMENTS 9,165,765 B1  10/2015  Raley et al.
9,620,380 B1 *  4/2017  Dai ..................... H01L 21/3086
(Continued)

FOREIGN PATENT DOCUMENTS

CN  1619774 A  5/2005
CN  103779187 A  5/2014
(Continued)

OTHER PUBLICATIONS

Office Action mailed on Aug. 2, 2022 related to Chinese Application No. 202010155794.4.
(Continued)

*Primary Examiner* — Bitew A Dinke
(74) *Attorney, Agent, or Firm* — Xuan Zhang

(57) ABSTRACT

A semiconductor structure includes a base layer with a top surface and a plurality of processed areas. A primary pattern is disposed on the top surface of the base layer, wherein the primary pattern has a pattern top surface, a sidewall, a processed area on the pattern top surface, and a sidewall, and the primary pattern has a first critical dimension, and the processed areas are on the part of the top surface of the base layer exposed by the primary pattern. A secondary pattern is disposed on the sidewall of the primary pattern, wherein the secondary pattern has a second critical dimension, and the second critical dimension is smaller than the first critical dimension.

11 Claims, 5 Drawing Sheets

(52) U.S. Cl.
CPC ...... *H01L 21/0332* (2013.01); *H01L 21/0335* (2013.01); *H01L 21/0337* (2013.01); *H01L 21/31155* (2013.01)

(56) References Cited

U.S. PATENT DOCUMENTS

| | | | | |
|---|---|---|---|---|
| 10,395,926 | B1* | 8/2019 | Tang | H01L 21/31144 |
| 2002/0072185 | A1 | 6/2002 | Chen | |
| 2007/0215960 | A1* | 9/2007 | Zhu | B82Y 10/00 |
| | | | | 438/689 |
| 2008/0122125 | A1* | 5/2008 | Zhou | H01L 21/3088 |
| | | | | 430/323 |
| 2009/0170286 | A1* | 7/2009 | Tsukamoto | H01L 21/76251 |
| | | | | 257/E21.563 |
| 2009/0294842 | A1* | 12/2009 | Juengling | H01L 21/32139 |
| | | | | 257/329 |
| 2010/0055922 | A1* | 3/2010 | Kim | H01L 21/31144 |
| | | | | 438/745 |
| 2011/0111596 | A1* | 5/2011 | Kanakasabapathy | |
| | | | | H01L 29/66795 |
| | | | | 438/479 |
| 2013/0032949 | A1* | 2/2013 | Lin | H01L 23/53295 |
| | | | | 257/774 |
| 2013/0089984 | A1* | 4/2013 | Raghunathan | H01L 21/0338 |
| | | | | 257/E21.257 |
| 2013/0230988 | A1* | 9/2013 | Shini | H01L 21/3088 |
| | | | | 438/703 |
| 2014/0027923 | A1* | 1/2014 | Tseng | H01L 21/0337 |
| | | | | 257/774 |
| 2015/0102400 | A1 | 4/2015 | Chen et al. | |
| 2015/0225850 | A1* | 8/2015 | Arora | C23C 16/407 |
| | | | | 216/51 |
| 2015/0270144 | A1 | 9/2015 | Chou | |
| 2017/0278715 | A1* | 9/2017 | Cheng | H01L 27/0924 |
| 2017/0373136 | A1 | 12/2017 | Moroz et al. | |
| 2018/0096846 | A1* | 4/2018 | Arnold | H01L 21/30621 |
| 2018/0151552 | A1* | 5/2018 | Sio | H01L 27/0886 |
| 2019/0318930 | A1* | 10/2019 | Chang | H01L 21/0337 |
| 2019/0363004 | A1* | 11/2019 | Cheng | H01L 21/76831 |
| 2020/0111668 | A1* | 4/2020 | O'Toole | H01L 21/31144 |
| 2020/0373161 | A1* | 11/2020 | Wang | H01L 21/0332 |

FOREIGN PATENT DOCUMENTS

| | | |
|---|---|---|
| CN | 104465323 A | 3/2015 |
| CN | 105374738 A | 3/2016 |
| CN | 107735851 A | 2/2018 |
| CN | 107887260 A | 4/2018 |

OTHER PUBLICATIONS

Fummary translation of Office Action mailed on Aug. 2, 2022 related to Chinese Application No. 202010155794.4.
Office Action mailed on May 6, 2023 related to Chinese Application No. 202010155794.4.
Office Action mailed on Apr. 13, 2022 related to Chinese Application No. 202010155794.4.
Summary translation of Office Action mailed on Apr. 13, 2022 related to Chinese Application No. 202010155794.4.

* cited by examiner

SEMICONDUCTOR DEVICE WITH REDUCED CRITICAL DIMENSIONS

CROSS-REFERENCE TO RELATED APPLICATION

This application is a divisional application of U.S. Non-Provisional application Ser. No. 16/440,354 filed Jun. 13, 2019, which is incorporated herein by reference in its entirety.

TECHNICAL FIELD

The present disclosure relates to a semiconductor structure, and more particularly, to a semiconductor structure with reduced critical dimensions.

DISCUSSION OF THE BACKGROUND

Reducing the size of integrated circuits (ICs) results in improved performance, increased capacity, and/or reduced cost. Size reduction, however, requires more sophisticated techniques for IC manufacturing. Photolithography is commonly used to pattern ICs and form features on a substrate. In order to continue reducing the scale of ICs, many techniques have been proposed in recent years for development of future generations of technology. Such processes include using a phase shift mask, an attenuated mask, a high numerical aperture (NA) monochromatic lithography tool, an extreme ultraviolet (UV) technique, and others.

However, due to factors such as optics and light or radiation wavelength, photolithography techniques have a minimum pitch, below which a particular photolithography technique may not reliably form features. Therefore, when devices are reduced to smaller dimensions, current lithography processes are challenged to create patterns with the required critical dimensions (CD). To avoid having to redesign the current lithography tools, new methods are needed to reduce the critical dimension of IC lines and via interconnects etched into a substrate.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. In one embodiment of the present disclosure, the semiconductor structure comprises: a base layer with a top surface; a primary pattern with a pattern top surface and a sidewall, disposed on the top surface of the base layer, wherein the primary pattern has a first critical dimension; a plurality of processed areas on the pattern top surface and on a portion of the top surface exposed by the primary pattern; and a secondary pattern disposed on the sidewall of the primary pattern, wherein the secondary pattern has a second critical dimension, and the second critical dimension is smaller than the first critical dimension.

In some embodiments, the base layer and the primary pattern comprise silicon.

In some embodiments, the secondary pattern comprises silicon dioxide.

In some embodiments, the base layer comprises a silicon substrate.

In some embodiments, the primary pattern comprises polysilicon.

In some embodiments, the processed areas comprise ion implantation damage.

Another aspect of the present disclosure provides a semiconductor structure. In one embodiment, the semiconductor structure comprises a base layer with a top surface and a plurality of processed areas on the top surface, wherein the processed areas have a first critical dimension and each of the processed areas has an edge; and a secondary pattern disposed along the edges of the processed areas on the top surface of the base layer, wherein the secondary pattern has a second critical dimension and the second critical dimension is smaller than the first critical dimension.

Yet another aspect of the present disclosure provides a method of manufacturing a semiconductor structure. In one embodiment, the method comprises the steps of forming a base layer with a top surface; forming a primary pattern with a first critical dimension on the top surface of the base layer, wherein the primary pattern has a pattern top surface and a sidewall; forming a plurality of processed areas on the pattern top surface of the primary pattern and on the top surface of the base layer exposed by the primary pattern; and selectively forming a secondary pattern on a part of the previously-formed structure excluding the processed areas.

In some embodiments, the method of manufacturing a semiconductor structure further comprises the step of removing a part of the base layer exposed by the primary pattern and the secondary primary pattern.

In some embodiments, the method of manufacturing a semiconductor structure further comprises the step of removing the primary pattern.

In some embodiments, the method of manufacturing a semiconductor structure further comprises the step of removing a part of the base layer exposed by the second pattern.

In some embodiments, the step of forming the primary pattern comprises chemical vapor deposition.

In some embodiments, the step of forming a processed area pattern comprises ion implantation, wherein the ion implantation damages the pattern top surface of the primary pattern and the part of the top surface of the base layer exposed by the primary pattern.

In some embodiments, the base layer and the first pattern comprise silicon, and the step of forming the secondary pattern comprises thermal oxidation.

In some embodiments, the base layer comprises a silicon substrate.

In some embodiments, the primary pattern comprises polysilicon.

In the method of manufacturing a semiconductor structure disclosed in one aspect of the present disclosure, the pattern top surface and the top surface exposed by the primary pattern are processed (e.g., damaged by ion implantation) so the secondary pattern is selectively formed only on the sidewall of the primary pattern, excluding the processed areas. Thus, the secondary pattern reduces the gaps between the features of the primary pattern. That is, the primary pattern and the secondary pattern combine to form a new pattern with a smaller gap. The resultant combined pattern of the semiconductor structure therefore has a smaller critical dimension than the original primary pattern.

Moreover, in another aspect of the present disclosure, the primary pattern is removed so only the secondary pattern is left on the base layer and replaces the primary pattern. The secondary pattern can be formed with non-photolithographic techniques and therefore has a second critical dimension smaller than the first critical dimension of the primary pattern, which is constrained by the limit of the photolithographic technique currently in use.

Since the secondary pattern can be formed by a process well-known in the art, such as thermal oxidation, the methods and structures disclosed in the present disclosure can therefore dramatically reduce the critical dimension of a pattern without the need of new techniques or tools, which can be very expensive and possibly problematic. Thus, by using the methods and structures provided by the present disclosure, ICs can be manufactured with features of reduced sizes without drastically increasing cost.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
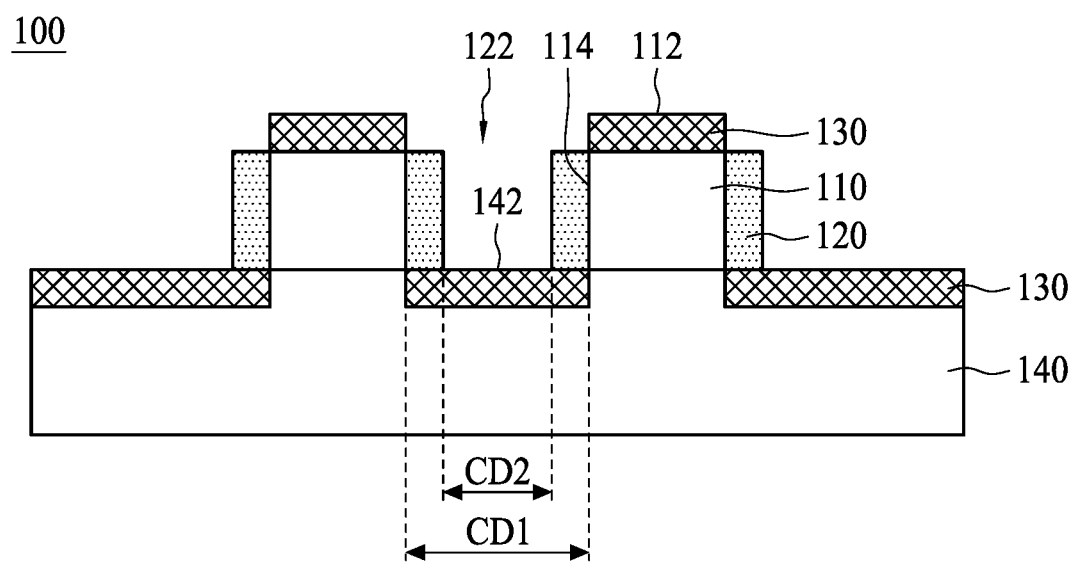
FIG. 1 is a sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of a semiconductor structure in accordance with some embodiments of the present disclosure. Please refer to FIG. 1. The semiconductor structure 100 provided in the present disclosure has a base layer 140, and the base layer 140 has a top surface 142. The base layer 140 has several processed areas 130 on the top surface 142. A primary pattern 110 is disposed on the top surface 142 of the base layer 140. The primary pattern 110 has a pattern top surface 112 and a sidewall 114. Several processed areas 130 are formed on the pattern top surface 112 of the primary pattern 110. The primary pattern 110 has a first critical dimension CD1, which may be defined as the smallest distance between the features of the primary pattern 110.

A secondary pattern 120 is disposed on the sidewall 114 of the primary pattern 110. The secondary pattern 120 has a second critical dimension CD2, which is smaller than the first critical dimension CD1 of the primary pattern 110. The secondary pattern 120 is disposed on the sidewall 114 of the primary pattern 110 and reduces the gaps between the features of the primary pattern 110, resulting in the smaller second critical dimension CD2. The method of manufacturing the semiconductor structure 100 provided in the present disclosure in accordance with some embodiments will be introduced in detail hereinafter.

Figure 2:
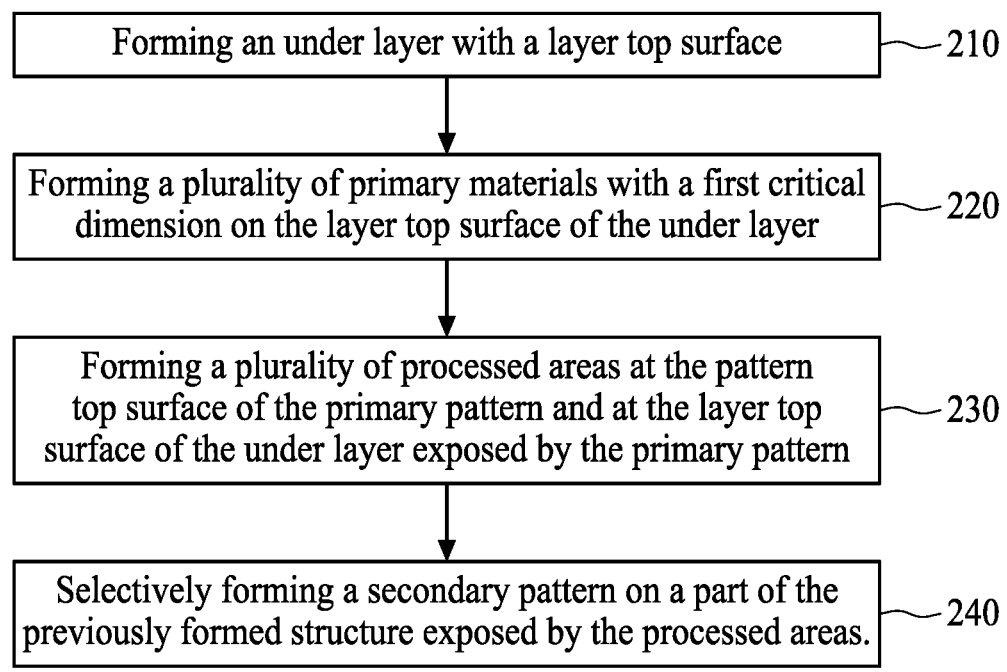
FIG. 2 is a flow diagram of a method of manufacturing a semiconductor structure in accordance with some embodiments of the present disclosure.
Figure 3:
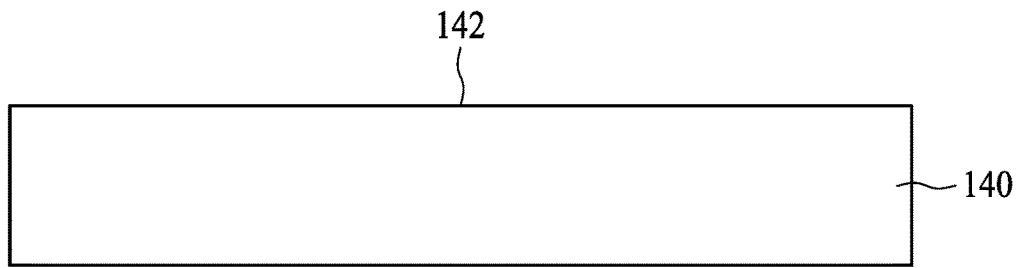
FIGS. 3 to 5 are sectional views of the results of the steps of a method of manufacturing a semiconductor structure in accordance with some embodiments of the present disclosure.
Figure 4:
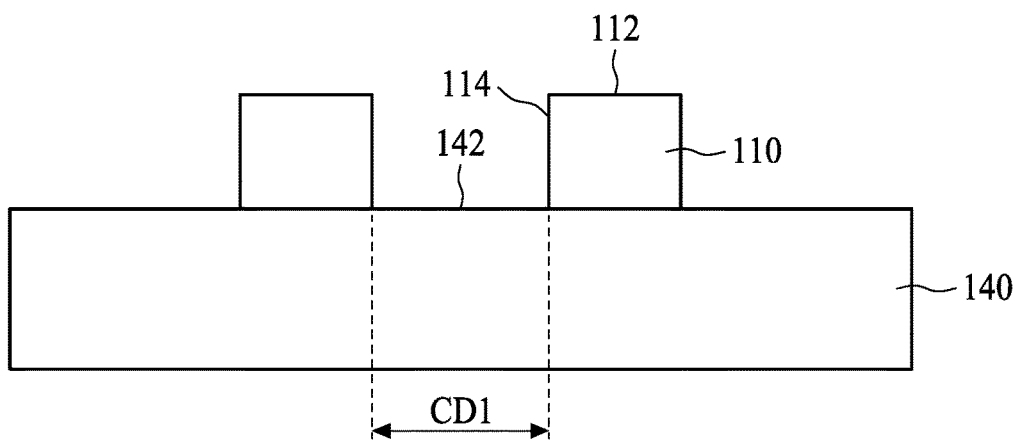
Figure 5:
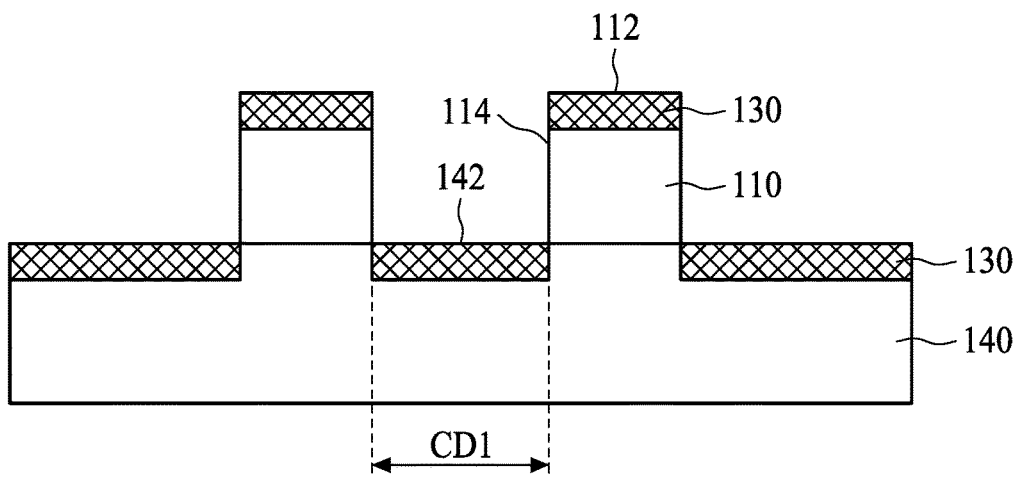

FIG. 2 is a flow diagram of a method of manufacturing a semiconductor structure in accordance with some embodiments of the present disclosure, and FIG. 3 to FIG. 5 are sectional views of the results of the steps of a method of manufacturing a semiconductor structure in accordance with some embodiments of the present disclosure.

Referring to FIG. 2 to FIG. 5, the first step 210 of the method of manufacturing a semiconductor structure 200 in accordance with some embodiments of the present disclosure comprises forming the base layer 140 with the top surface 142. In one embodiment, the base layer 140 may be a layer of polysilicon or amorphous silicon disposed on a substrate (not shown) or other materials, such as a conductor layer. More specifically, the base layer 140 can be formed by the process of physical vapor deposition (PVD) such as sputtering, or by chemical vapor deposition (CVD). For example, in one embodiment, low-pressure chemical vapor deposition (LPCVD) is used to form the base layer 140. Silane ($SiH_4$) is heated to decompose and form the base layer 140 from silicon. Amorphous silicon can be deposited when the temperature is below 575° C., while polysilicon can be obtained when the temperature is between 525° C. and 575° C. In some other embodiments, the base layer 140 can be a silicon substrate itself, depending on the application, as will be described in more detail in later sections.

The next step 220 is to form the primary pattern 110 with the pattern top surface 112 and the sidewall 114 on the top surface 142 of the base layer 140. In one embodiment, the material of the primary pattern 110 can be silicon, more specifically amorphous silicon or polysilicon. This step can be performed with traditional photolithographic techniques, and the first critical dimension CD1 of the primary pattern 110 is limited by the photolithographic techniques used.

Next, in step 230, processed areas 130 are formed on the pattern top surface 112 of the primary pattern 110 and on the portion of the top surface 142 of the base layer 140 that is exposed by the primary pattern 110. In one embodiment of the present disclosure, the formation of the processed areas 130 may include a process of ion implantation. In contrast to the traditional ion implantation used for doping, the purpose of the ion implantation in the present embodiment is to damage the horizontal surfaces of the previously-formed semiconductor structure, namely the pattern top surface 112 and the top surface 142 exposed by the primary pattern 110, to form processed areas 130 so that the subsequent formation of the secondary pattern 120 may exclude the processed areas 130.

Next, in step 240, the secondary pattern 120 is formed on the sidewalls 114 of the primary pattern 110. As previously mentioned, the processed areas 130, which includes all exposed horizontal surfaces, are damaged so the secondary pattern 120 cannot form on them. The secondary pattern 120 is therefore formed only on the sidewalls 114 of the primary pattern 110. In one embodiment, the formation of the secondary pattern 120 may include thermal oxidation and the primary pattern 110 may include silicon. Thermal oxidation oxidizes the sidewall 114 of the primary pattern 110 and forms a layer of silicon dioxide, which comprises the secondary pattern 120; while the other surfaces, such as the pattern top surface 112 and the top surface 142 exposed by the primary pattern 110, are processed so that no silicon dioxide can be formed thereon. The aforementioned ion implantation can be used in such an embodiment to damage the processed areas 130 to limit the oxidation of the sidewall 114 of the primary pattern 110.

Since the secondary pattern 120 is not formed by photolithographic techniques, the second critical dimension CD2 is not constrained by the limit of the techniques in use. For example, in the aforementioned embodiment, the secondary pattern 120 is formed by thermal oxidation so that the oxidation layer of the sidewall 114 of the primary pattern 110 can be easily controlled to reduce the first critical dimension CD1 of the primary pattern 110 to the second critical dimension CD2 of the secondary pattern 120 since thermal oxidation is well-practiced for people having ordinary skill in the art. Thus, a smaller critical dimension may be achieved without employing new but possibly faulty and costly photolithographic techniques.

In one embodiment, the base layer 140 is a silicon substrate, and the gaps 122 between the lines of the secondary pattern 120 form contact holes, which can be filled with conductive materials such as tungsten to form plugs (not shown) connecting the base layer 140 and other layers subsequently formed on the primary pattern 110 and the secondary pattern 120. For example, in one embodiment, tungsten can be deposited on semiconductor structure 100 and in the gaps 122 between the lines of the secondary pattern 120. The previously-formed structure can then be etched to remove the tungsten from the primary pattern 110 and the secondary pattern 120 so that only the tungsten in the contact holes remains to form the plugs. In other embodiments, other conductive materials such as aluminum and copper can be used to form the plugs. The plugs formed will have a smaller second critical dimension CD2 instead of the first critical dimension CD1 which is determined by the photolithographic techniques employed.

Figure 6:
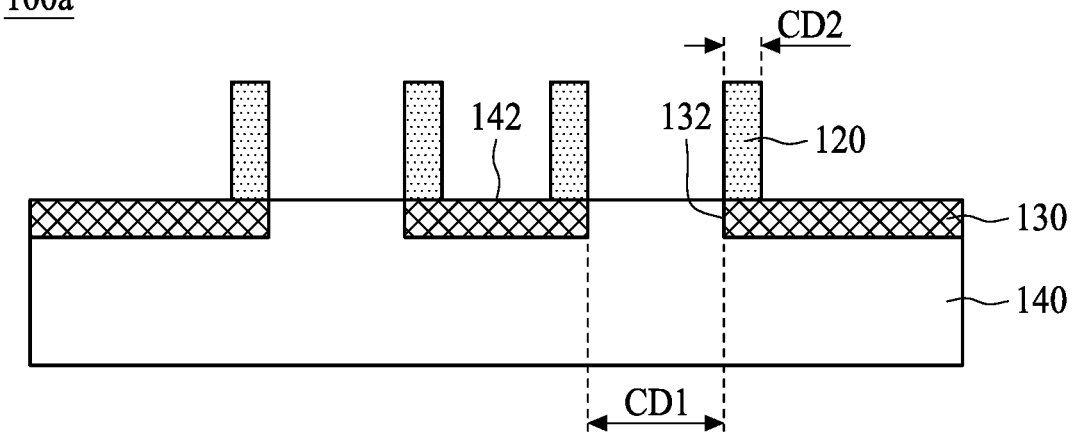
FIGS. 6 to 8 are sectional views of semiconductor structures in accordance with some embodiments of the present disclosure.

In another method of manufacturing the semiconductor structure in accordance with the present disclosure, the method may further include a step of removing the primary pattern 110. FIG. 6 is a sectional view of a semiconductor structure in accordance with some embodiments of the present disclosure.

Please refer to FIG. 5 and FIG. 6. The semiconductor structure 100a in accordance with the present disclosure has a base layer 140 with a top surface 142, a secondary pattern 120, and multiple processed areas 130. The secondary pattern 120 is disposed along the edge 132 of the processed area 130. The difference between the semiconductor structure 100 in the embodiment of FIG. 5 and the semiconductor structure 100a in the embodiment of FIG. 6 is that the primary pattern 110 is removed. The secondary pattern 120 is left on the position where the sidewall 114 of the primary pattern 110 existed, which is the edges 132 of the processed areas 130 since the processed areas 130 are formed on the top surface 142 exposed by the primary pattern 110.

In this embodiment, the first critical dimension CD1 may be equal in size to the gaps between the processed areas 130, which is the same as the line width of the primary pattern 110 previously formed in the embodiment illustrated in FIG. 5, and the second critical dimension CD2 is equal in size to the line width of the secondary pattern 120, which can be significantly smaller than the first critical dimension CD1 if a process such as thermal oxidation is employed as in one embodiment of the present disclosure.

In some embodiments of the present disclosure, the semiconductor structures 100 and 100a can be used as part of a semiconductor device, or as a mask for an etching process. For example, in the semiconductor structure 100 in FIG. 6, the base layer 140 can be a silicon substrate, and the secondary pattern 120 can be used as gate oxides, which are commonly silicon oxides.

Figure 7:
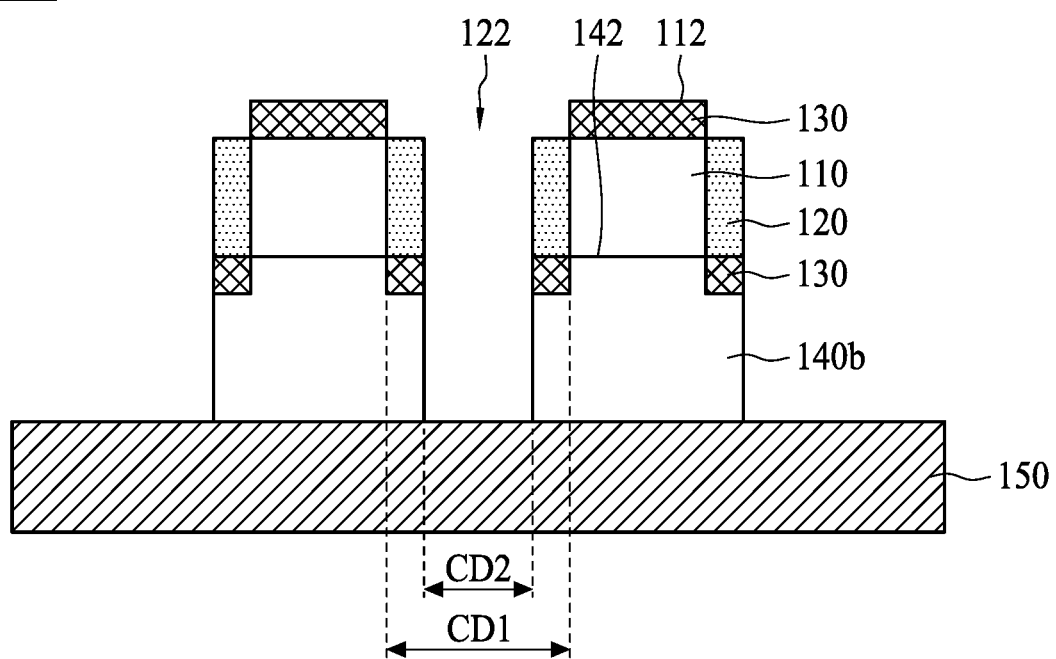

As for the examples of using the semiconductor structure 100 and 100a as a mask, please refer to FIG. 5 and FIG. 7. FIG. 7 is a sectional view of a semiconductor structure 100b in accordance with some embodiments of the present disclosure. In this embodiment, the semiconductor structure 100b further has an under layer 150, which can be a conductive layer such as an aluminum layer in some embodiments, and the partly-removed base layer 140b is disposed thereon. The part of the base layer 140b exposed by the primary pattern 110 and the secondary pattern 120 is removed to reveal the conductive layer 150 underneath. The primary pattern 110 and the secondary pattern 120 can be used as a mask along with the partly-removed base layer 140b. The under layer 150 can then be etched to form a pattern with the second critical dimension CD2.

In another embodiment, the gaps 122 between the lines of the secondary pattern 120 and the gap between portions of the partly removed base layer 140b may form contact holes for the under layer 150.

In some embodiments, removing the part of the base layer 140 may involve the process of etching. Since the secondary pattern 120 and the base layer 140 are formed of different materials, a process of wet etching can be used to etch away the part of the base layer 140 exposed by the secondary pattern 120 and the primary pattern 110 if the chemical etchant is carefully selected.

Figure 8:
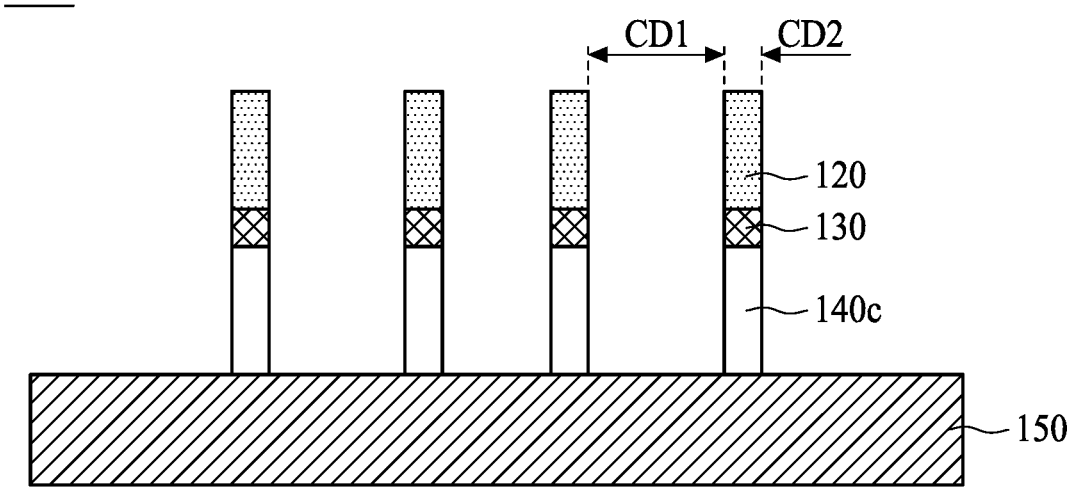

FIG. 8 is a sectional view of a semiconductor structure in accordance with some embodiments of the present disclosure. Referring to FIG. 6 and FIG. 8, in the semiconductor structure 100c in FIG. 8, the part of the base layer 140 exposed by the secondary pattern 120 is further removed so that only the partly-removed base layer 140c covered by the secondary pattern 120 is left remaining. The secondary pattern 120 and the partly-removed base layer 140c can be used as a mask for an etching process for further patterning the under layer 150. The patterned under layer 150 may have a line width of the second critical dimension CD2.

In summary, in the semiconductor structure provided by the present disclosure, the horizontal surfaces of the semiconductor structure 100, which comprise the pattern top surface 112 and the top surface 142 exposed by the primary pattern 110, are damaged so the secondary pattern 120 can only be formed on the sidewall 114 of the primary pattern 110. The secondary pattern 120 can reduce the gaps between the lines of the primary pattern 110, or can form a replacement pattern itself by removing the primary pattern 110. The resultant pattern (a combination of the primary pattern 110 and the secondary pattern 120, or only the secondary pattern 120) has a second critical dimension CD2 smaller than the first critical dimension CD1, which is determined by the photolithographic techniques used to form the primary pattern 110. The techniques used to form the secondary pattern 120 can be a process well known in the art, such as thermal oxidation, so that the smaller second critical dimension CD2 can be achieved without needing new and drastically more expensive and possibly unreliable photolithographic techniques. The production of ICs of reduced sizes and more features can then be achieved more economically.

In one embodiment, the semiconductor structure provided in the present disclosure has a base layer, and the base layer has a top surface. A primary pattern is disposed on the top surface of the base layer. The primary pattern is formed with a first critical dimension, and has a pattern top surface and a sidewall. Several processed areas are formed on the pattern top surface of the primary pattern and on the part of the top surface that is exposed by the primary pattern. A secondary pattern is disposed on the sidewall of the primary pattern. The secondary pattern has a second critical dimension, which is smaller than the first critical dimension of the primary pattern.

In another embodiment, the semiconductor structure comprises a base layer with a top surface. Multiple processed areas are formed on the top surface, the processed areas have a first critical dimension and each of the processed areas has an edge. A secondary pattern is disposed along the edges of the processed areas on the top surface of the base layer and the secondary pattern has a second critical dimension, which is smaller than the first critical dimension.

In yet another embodiment of the present disclosure, a method of manufacturing a semiconductor structure is provided. The method begins with the steps of forming a base layer with a top surface. Next, a primary pattern with a first critical dimension is formed on the top surface of the base layer, and the primary pattern has a pattern top surface and a sidewall. Next, several processed areas are formed on the pattern top surface of the primary pattern and on the top surface of the base layer exposed by the primary pattern. Finally, a secondary pattern is selectively formed on a part of the previously-formed structure excluding the processed areas.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
   a base layer with a top surface;
   a primary pattern with a pattern top surface and a sidewall, disposed on the top surface of the base layer, wherein the primary pattern has a first critical dimension;
   a plurality of first ion implantation layers formed on the pattern top surface and a plurality of second ion implantation layers formed on a part of the top surface of the base layer exposed by the primary pattern, wherein the first ion implantation layers and the second implantation layers form a plurality of processed areas on the pattern top surface and the part of the top surface of the base layer exposed by the primary pattern, wherein the first ion implantation layers and the second implantation layers have no contact with each other; and
   a secondary pattern disposed on the sidewall of the primary pattern, wherein the secondary pattern has a second critical dimension, and the second critical dimension is smaller than the first critical dimension, wherein the secondary pattern has no contact with the first ion implantation layers while the secondary pattern is direct contact with at least one of the second implantation layers.

2. The semiconductor structure of claim 1, wherein the base layer and the primary pattern comprise silicon, wherein the first ion implantation layers and the second implantation layers are parallel with each other, wherein the secondary pattern is perpendicular to each of the first ion implantation layers and the second implantation layers.

3. The semiconductor structure of claim 2, wherein the secondary pattern comprises silicon dioxide.

4. The semiconductor structure of claim 2, wherein the base layer comprises a silicon substrate.

5. The semiconductor structure of claim 2, wherein the primary pattern comprises polysilicon.

6. The semiconductor structure of claim 1, wherein the processed areas comprise ion implantation damage.

7. A semiconductor structure, comprising:
   a base layer with a top surface;
   a plurality of ion implantation layers formed on the top surface to form a plurality of processed areas thereon, wherein the processed areas have a first critical dimension and each of the ion implantation layers has a connecting edge; and
   a secondary pattern formed on at least one of the ion implantation layers, wherein the second pattern has a connecting edge disposed along and in direct contact with the edge of the ion implantation layer on the top surface of the base layer, wherein the connecting edge of the second pattern is shorter than the connecting edge of each of the ion implantation layers, wherein the secondary pattern has a second critical dimension and the second critical dimension is smaller than the first critical dimension.

8. The semiconductor structure of claim 7, wherein the base layer comprises silicon, wherein the secondary pattern is perpendicular to each of the ion implantation layers.

9. The semiconductor structure of claim 8, wherein the base layer comprises a silicon substrate.

10. The semiconductor structure of claim 8, wherein the secondary pattern comprises silicon dioxide.

11. The semiconductor structure of claim 7, wherein the processed areas comprise ion implantation damage.

* * * * *